US008981218B1

(12) United States Patent
Kono et al.

(10) Patent No.: US 8,981,218 B1
(45) Date of Patent: Mar. 17, 2015

(54) ELECTRONIC ENCLOSURE WITH TOP-FACING VENTING

(71) Applicant: Western Digital Technologies, Inc., Irvine, CA (US)

(72) Inventors: Takashi Kono, Monterey Park, CA (US); Bruce A. Cariker, Diamond Bar, CA (US); Michael J. Bowman, Fullerton, CA (US); Steven T. Peng, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 148 days.

(21) Appl. No.: 13/723,079

(22) Filed: Dec. 20, 2012

(51) Int. Cl.
*H02G 3/08* (2006.01)
*H05K 7/14* (2006.01)
*H05K 5/02* (2006.01)

(52) U.S. Cl.
CPC ............ *H05K 7/1427* (2013.01); *H05K 5/0213* (2013.01); *Y10S 248/906* (2013.01)
USPC ................ 174/50; 174/63; 439/535; 248/906

(58) Field of Classification Search
USPC ................... 174/50, 58, 63; 439/535; 248/906
See application file for complete search history.

(56) References Cited

U.S. PATENT DOCUMENTS

| | | | | |
|---|---|---|---|---|
| 5,165,563 A | * | 11/1992 | McKendry | 220/254.8 |
| 6,108,202 A | * | 8/2000 | Sumida | 361/690 |
| D463,415 S | | 9/2002 | Tomino et al. | |
| D530,315 S | | 10/2006 | Liu | |
| 7,701,705 B1 | | 4/2010 | Szeremeta | |
| 7,807,923 B2 | * | 10/2010 | Moran | 174/50 |
| D640,692 S | | 6/2011 | Waisman-Diamond | |
| 8,003,885 B2 | * | 8/2011 | Richter et al. | 174/50 |
| 8,064,194 B2 | | 11/2011 | Szeremeta | |
| 8,113,873 B1 | | 2/2012 | Sarraf | |
| 8,133,426 B1 | | 3/2012 | Yurchenco et al. | |
| D662,496 S | | 6/2012 | Lewis et al. | |
| 8,358,395 B1 | | 1/2013 | Szeremeta | |
| 8,417,979 B2 | | 4/2013 | Maroney | |
| 8,462,460 B1 | | 6/2013 | Szeremeta et al. | |
| 8,498,088 B1 | | 7/2013 | Klein | |
| 8,547,658 B1 | | 10/2013 | Szeremeta | |
| D707,667 S | | 6/2014 | Kono et al. | |
| 2009/0116187 A1 | | 5/2009 | Yi et al. | |

* cited by examiner

*Primary Examiner* — Dhirubhai R Patel

(57) ABSTRACT

A device includes a first enclosure portion; a second enclosure portion; and a mechanical interface between the first enclosure portion and the second enclosure portion. The mechanical interface may be configured to couple the first enclosure portion to the second enclosure portion to thereby define a housing interior volume. The mechanical interface may be further configured to enable ventilation from the housing interior volume to an exterior of the device.

21 Claims, 5 Drawing Sheets

ELECTRONIC ENCLOSURE WITH TOP-FACING VENTING

BACKGROUND

Adequate venting is an important consideration in the design of enclosures for heat-generating devices such as electronic devices. Such venting is crucial to enable dissipation of potentially damaging heat build-up within the device. To accomplish this, conventional enclosures resort to various arrangements of slots, openings, fans to facilitate heat dissipation. However, slots on the side of the housing are not ideally placed, given the convection patterns of hot air within the enclosure. Slots or openings on the top surface of the enclosure in practice are often not effective, as users tend to stack electronic devices or place objects on top of the enclosure, thereby blocking the top surface-facing vents and contributing to a potentially damaging heat build-up within the enclosure. Other solutions result in significant temperature differentials within the enclosure or rely on discrete additional parts, which may be cost-prohibitive within the context of high-volume manufacturing.

DETAILED DESCRIPTION

According to one embodiment, an enclosure for a heat-generating device may comprise a bottom housing and a top cover. The heat-generating device may comprise, for example, an electronic device. According to one embodiment, the mechanical structures used to support the coupling of the bottom housing and the top cover are also the structures that enable venting from an enclosed volume formed by the mated bottom housing and top cover to the outside environment. Advantageously, such mechanical structures simplify the enclosure manufacturability by minimizing part is complexity and part count, as well as maintaining the overall aesthetic of the product.

Figure 1:
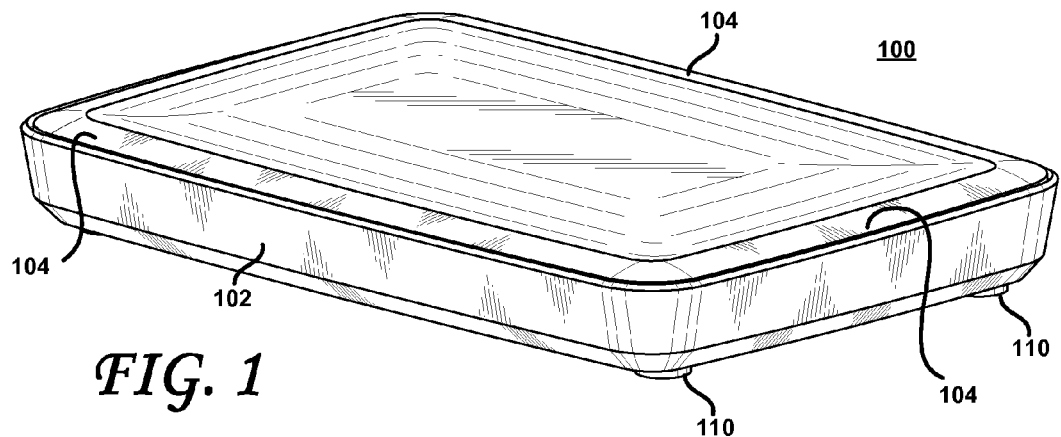
FIG. 1 shows a top perspective view of an enclosure according to one embodiment.
Figure 2:
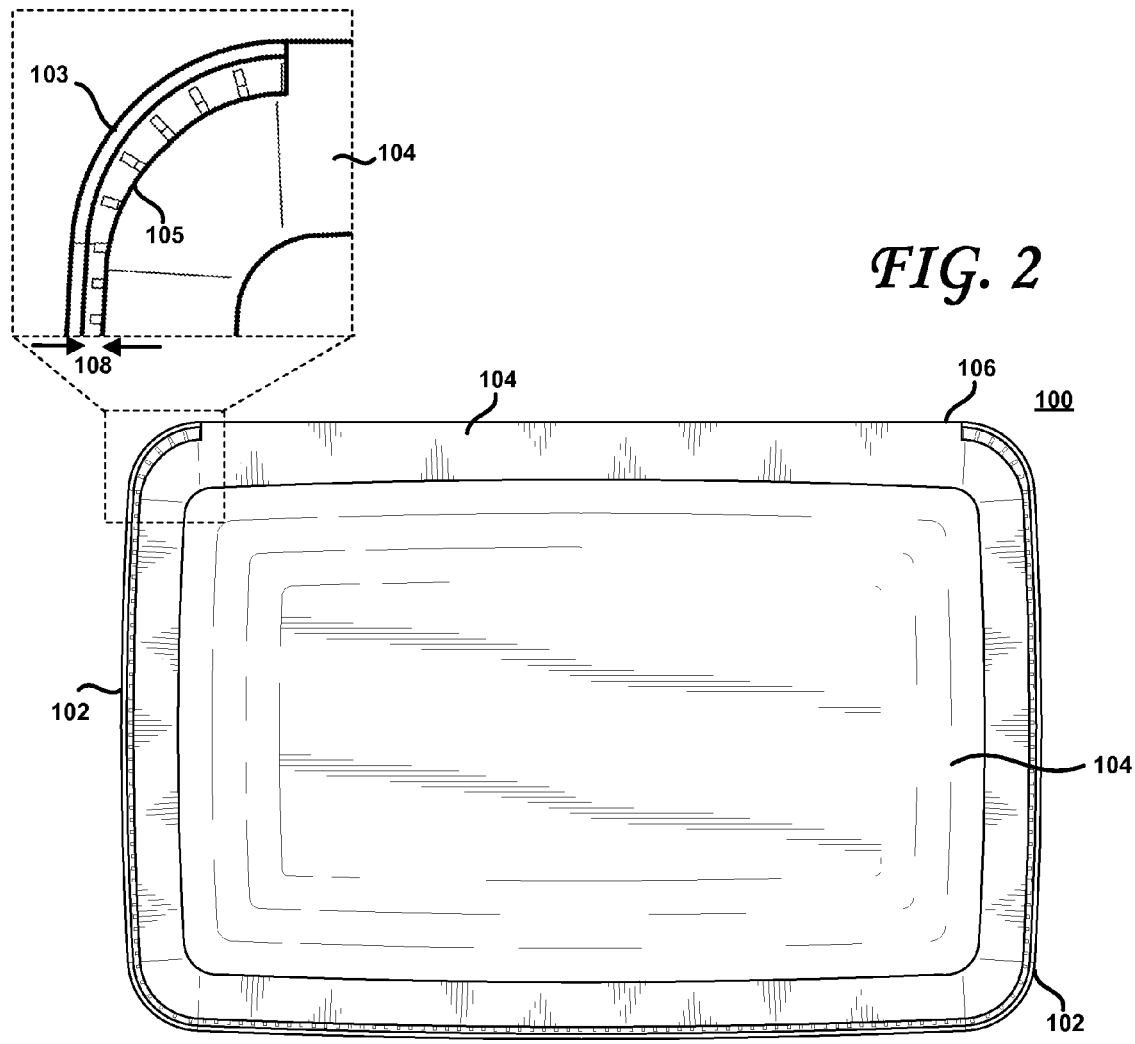
FIG. 2 shows a top view of an enclosure according to one embodiment.

FIG. 1 shows a top perspective view of an enclosure according to one embodiment. FIG. 2 shows a top view of an enclosure according to one embodiment. Considering FIGS. 1 and 2 collectively, an enclosure 100 according to one embodiment may comprise a bottom housing 102 and a top cover 104. The bottom housing may define a bottom (not shown in FIGS. 1 and 2) and a plurality of sides (two of which are shown in FIG. 1) that rise from the bottom at an angle therewith to define an inner peripheral surface 103 of the bottom housing. The top cover 104, according to one embodiment, may be configured to couple with the bottom housing 102 to thereby define an inner housing volume. One or more heat-generating devices may be fitted within the so-defined inner housing volume. For example, an electronic device such as a router may be fitted within the inner housing volume. The top cover 104 may, according to one embodiment, define an outer periphery 105 and may be configured to fit within the inner peripheral surface 103 of the bottom housing 102 to define a peripheral air gap 108 between the outer periphery 105 of the top cover and the top-facing inner peripheral surface 103 of the bottom housing 102. In this manner, the peripheral air gap 108 may be characterized as a raceway at least partially around the periphery of the bottom housing 102

As best shown in FIG. 2, the top-facing peripheral air gap 108 may extend at least partially around the enclosure. In the embodiment of FIG. 2, the bottom housing and the top cover 104 are configured such that the top-facing peripheral air gap 108 extends over three of the four sides of the housing 100. According to one embodiment, the top-facing peripheral air gap 108 may extend over a smaller proportion of the periphery of the housing 100. Alternatively, according to one embodiment, the top-facing peripheral air gap may extend over the entire periphery of the housing 100. That is, the bottom housing 102 and the top cover 104 may be configured such that the peripheral air gap 108 is co-extensive with the inner peripheral surface 103. Other variations are possible. Indeed, according to one embodiment, the top-facing peripheral air gap 108 may extend continuously around at least a portion of the periphery of the is housing 100, as shown in FIG. 2. Indeed, the bottom housing 102 and the top cover 104 may be configured such that the peripheral air gap 108 is defined adjacent a portion of the inner peripheral surface 103 of the bottom housing 102. According to one embodiment, however, the top-facing air gap may be only piece-wise continuous, as the top-facing peripheral air gap 108 may comprise alternating and adjacent gap and solid portions, in which the gap portions enable venting and the solid portions do not. Other variations may occur to those of skill in this art, and all such variations are to be considered as additional embodiments within the present scope.

It is to be noted that the top-facing peripheral gap 108 defined by the outer periphery 105 of the top cover 104 and the inner peripheral surface 103 of the bottom housing 102 facilitates convection and ventilation of heated air from the inner housing volume to the outside environment.

As also shown in FIG. 2, the top cover 104 may comprise an overlap surface 106 that extends beyond the inner peripheral surface 103 of the bottom housing 102. When so configured, the overlap surface 106 may extend to form at least a portion of a side surface of the enclosure when the top cover 104 is coupled to the bottom housing 102. Such side surface may accommodate, for example, power and data connectors (not shown).

Figure 3:
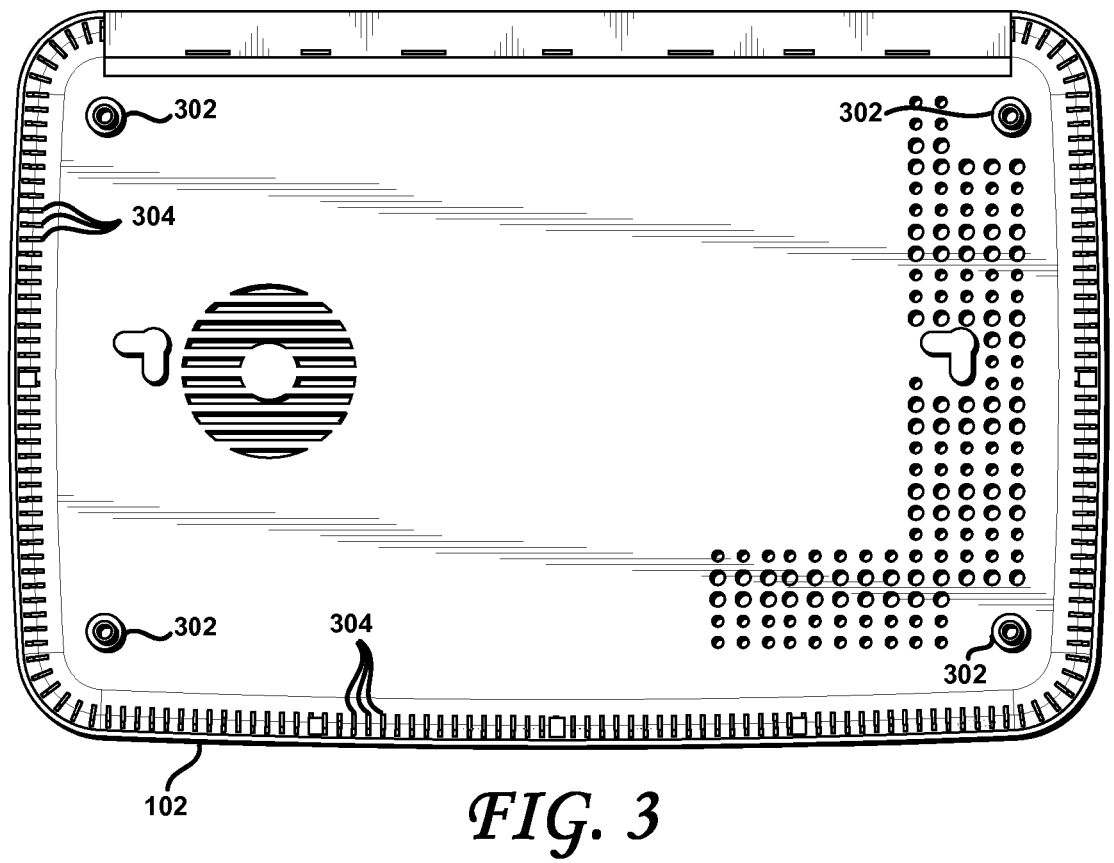
FIG. 3 shows a top view of the bottom housing portion of an enclosure according to one embodiment.
Figure 4:
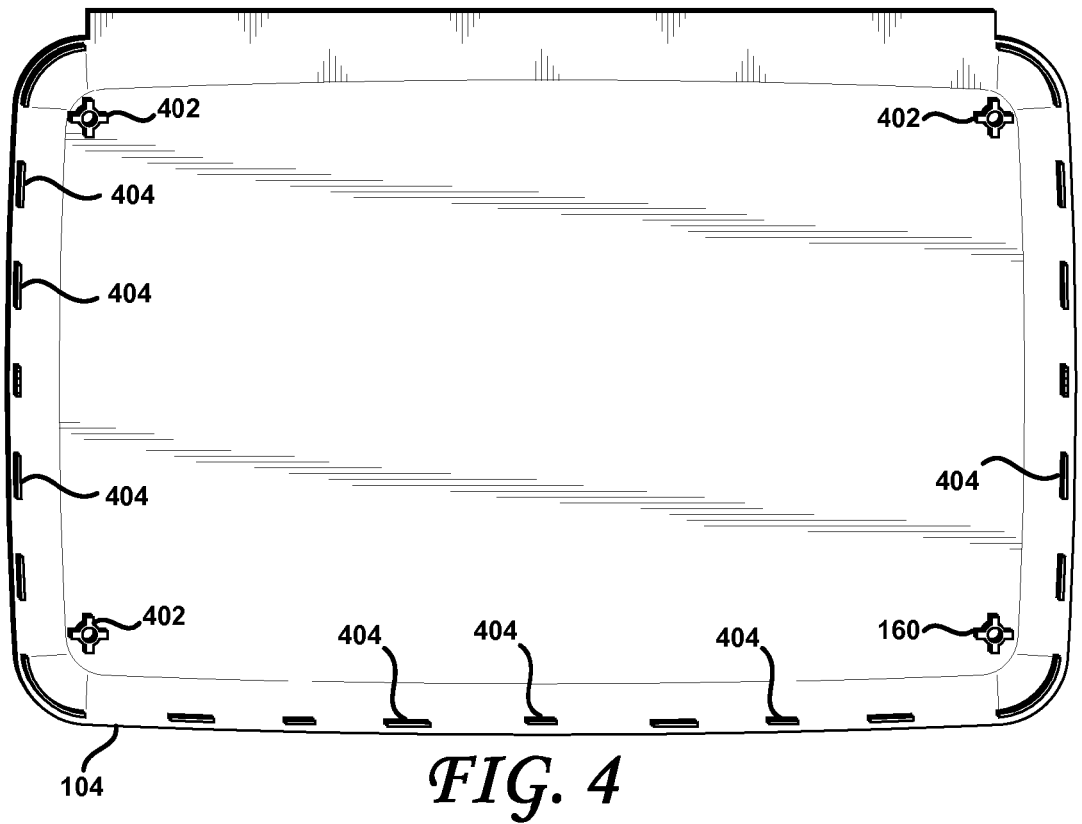
FIG. 4 shows a top view of the underside of the top cover portion of the housing, showing structures configured to mate with the bottom housing, according to one embodiment.

FIG. 3 shows a top view of the bottom housing 102 of an enclosure 100 according to one embodiment. FIG. 4 shows a top view of the underside of the top cover 104 portion of the housing 100, showing structures configured to mate with the bottom housing, according to one embodiment. As shown, the bottom housing 102 may comprise a plurality of fastener guides 302. The fastener guides 302 may be aligned with bottom housing feet structures (reference numerals 110 in FIG. 1), and may be configured to receive a fastener, such as a screw. The top cover 104 may comprise a corresponding number of fastener-receiving posts 402 aligned, when the bottom housing 102 and the top cover 104 are mated to one another, with the fastener guides 302. The fastener-receiving posts 402 may each define a blind bore into which a fastener may be secured. According to one embodiment, to secure the bottom housing 102 to the top cover 104, a screw may be inserted in each of the fastener guides 302 and into the blind bore of a corresponding and aligned fastener-receiving post 402. The screws or other fasteners may then be tightened to secure the top cover 104 onto the bottom housing 102. Other mechanisms of attaching the top cover 104 to the bottom housing 102 may be devised and readily implemented, as those of skill in this art may recognize. For example, the top cover 104 may be snap- or interference-fitted to the bottom cover 104.

According to one embodiment, both the bottom housing 102 and the top cover 104 comprise structures that together precisely seat the top cover 104 within the peripheral surface 103 of the bottom housing 102 to thereby define the top-facing peripheral gap 108. For example, such structures may comprise a plurality of first solid features on one of the bottom housing 102 and the top cover 104 and a plurality of second solid features on the other one of the bottom housing 102 and the top cover 104. Some of the first solid features may mate or otherwise engage with the second solid features to define the top-facing peripheral air gap 108 when the top cover 104 is mated to the bottom housing 102. According to one embodiment, and as shown in FIG. 3, the bottom housing 102 may comprises a plurality of ventilation posts 304. The ventilation posts 304 may be spaced apart from one another and may extend from an inner sidewall of the inner peripheral surface 103. At least some of these ventilation posts 304 may, according to one embodiment, define notched portions configured to receive corresponding top cover features of the top cover 104 that are aligned therewith when the top cover 104 is mated to the bottom housing 102. Indeed, as shown in FIG. 4, the top cover 104 may comprise a plurality of top cover features that are configured to align with and engage with at least some of the plurality of ventilation posts 304. In the embodiment of FIG. 4, such top cover features are configured as tabs 404. Other implementations of the top cover features are possible, as those of skill in this may recognize.

Figure 5:
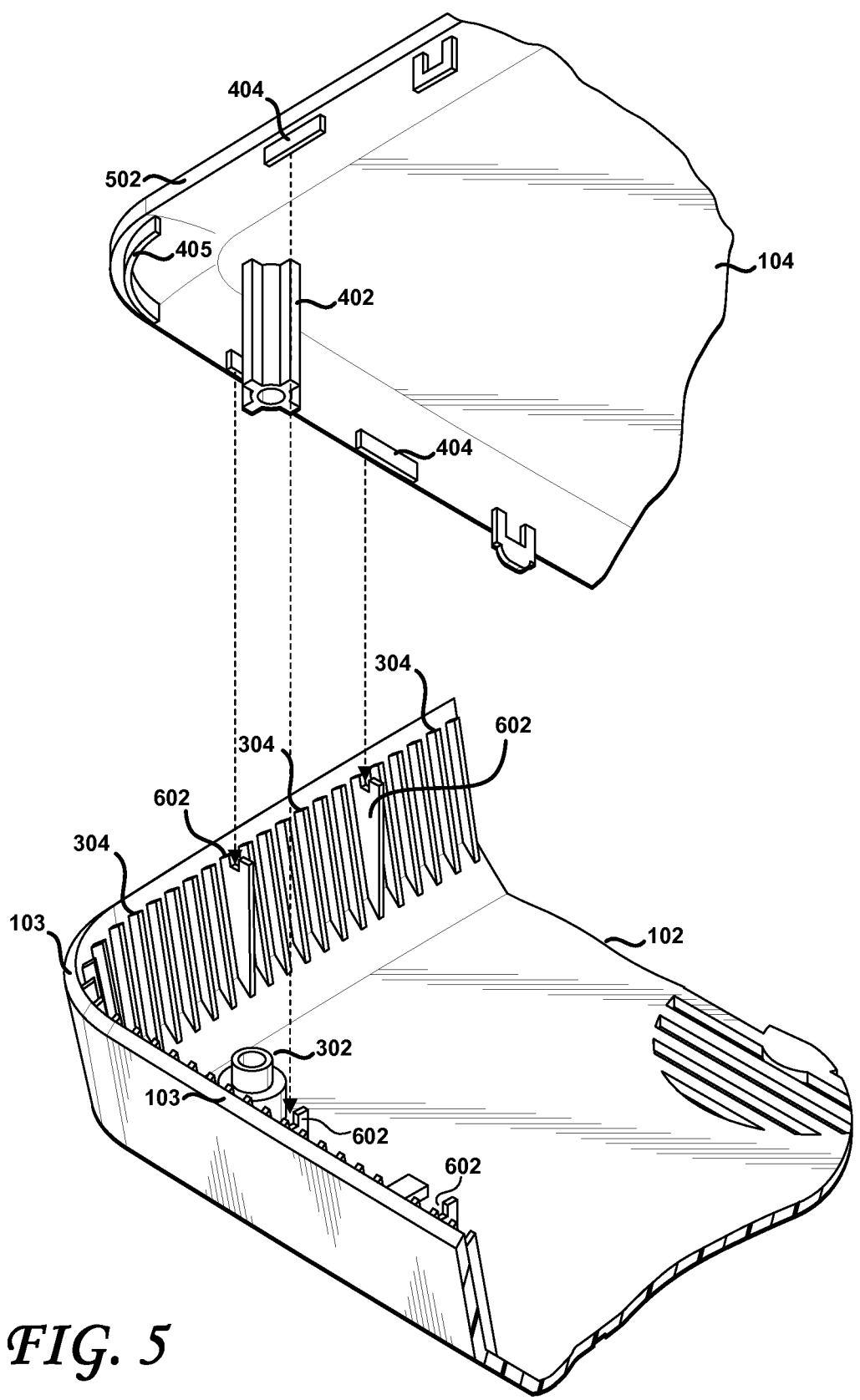
FIG. 5 is a detail perspective view of the underside of the top cover portion of the housing and a detail perspective view of the bottom housing of an enclosure, according to one embodiment.

FIG. 5 is a detail perspective view of the underside of the top cover 104 and a detail perspective view of the bottom housing 102 of an enclosure according to one embodiment, showing the manner in which they may be mated to one another to thereby define the peripheral gap 108. As shown, the top cover 104 may comprise a is plurality of tabs 404 that are spaced from one another and recessed with respect to the outer periphery of the top cover 104. As also shown in FIG. 5, the bottom housing 102 may comprise a plurality of ventilation posts 304 that are spaced from one another and that extend from an inner sidewall of the outer peripheral surface 103 of the bottom housing 102 toward the interior of the enclosure. At least some of the ventilation posts 304 may define or otherwise comprise a notch 602 configured to receive a correspondingly-disposed tab 404 when the top cover 104 is mated to the bottom housing 102. In this manner, the ventilation posts 304 may be configured to support the top cover 104 when the top cover 104 is coupled to the bottom housing 102. Other tabs or features, such as shown at 405 in the top cover 104, may not be aligned with a ventilation post 304 comprising a notch 602. Such tabs or features 405 may be configured to abut the side of correspondingly-disposed ventilation posts 304 so as to securely seat the cover 104 onto the bottom housing 102. According to one embodiment, the tabs 404 may be configured to engage and friction-fit with corresponding notches 602 in the ventilation posts 304 of the bottom housing 102. In this manner, the top cover 104 may be configured to fit within the inner peripheral surface 103 of the bottom housing 102 to define a peripheral air gap 108 between the outer periphery 502 of the top cover 104 and the inner peripheral surface 103 of the bottom housing 102.

As shown in FIG. 5, one or more of the ventilation posts may be configured as a rib extending from at least one of the plurality of sides. Such ribs not only support and precisely position the top cover 104 on the bottom housing 102, they also lend structural rigidity to the enclosure as a whole without significant cost or weight penalties.

Figure 6:
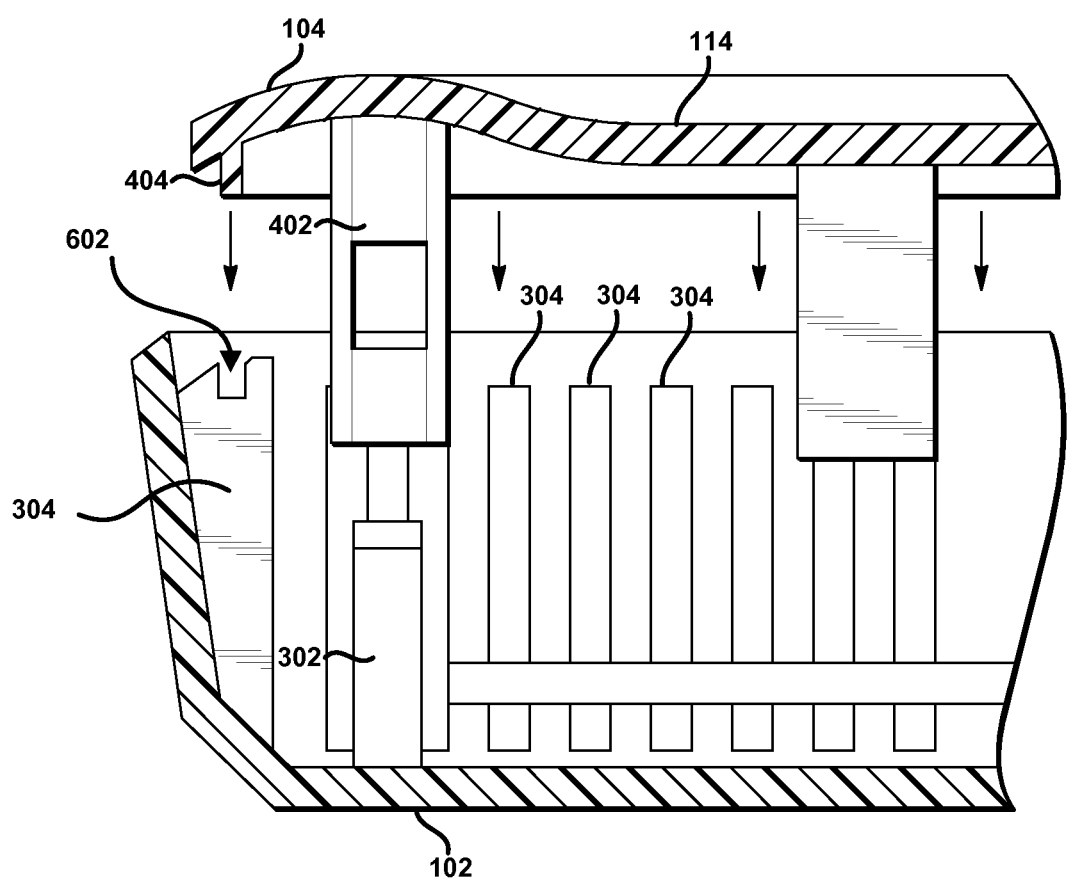
FIG. 6 is a cross-sectional view of a portion of the bottom housing and top cover of an enclosure according to one embodiment.

FIG. 6 is a cross-sectional view of a portion of the bottom housing and top cover of an enclosure according to one embodiment. As shown, at least some of the tabs 404 are aligned and configured to engage with notches 602 defined within at least some of the ventilation posts 304. As also shown in FIG. 6, according to one embodiment, the top cover 104 may comprise a convex upper surface 114. Also shown in FIG. 6 is one of the fastener-receiving posts 402 aligned and engaging with a corresponding fastener guide 302.

Figure 7:
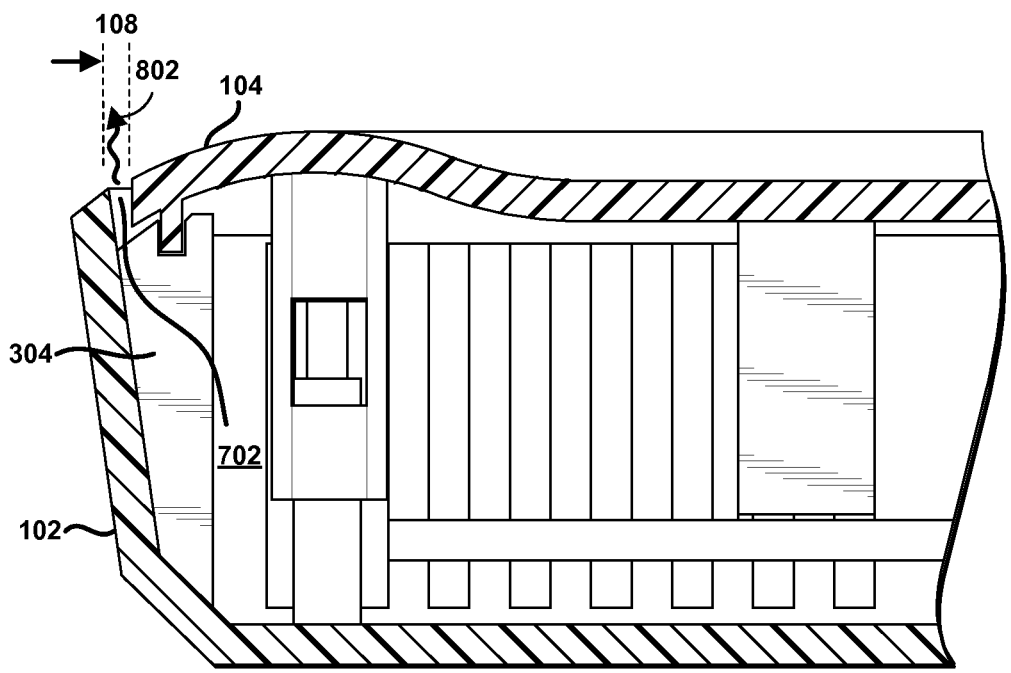
FIG. 7 is a cross-sectional view of a portion of the bottom housing mated to the top cover of an enclosure according to one embodiment.
Figure 8:
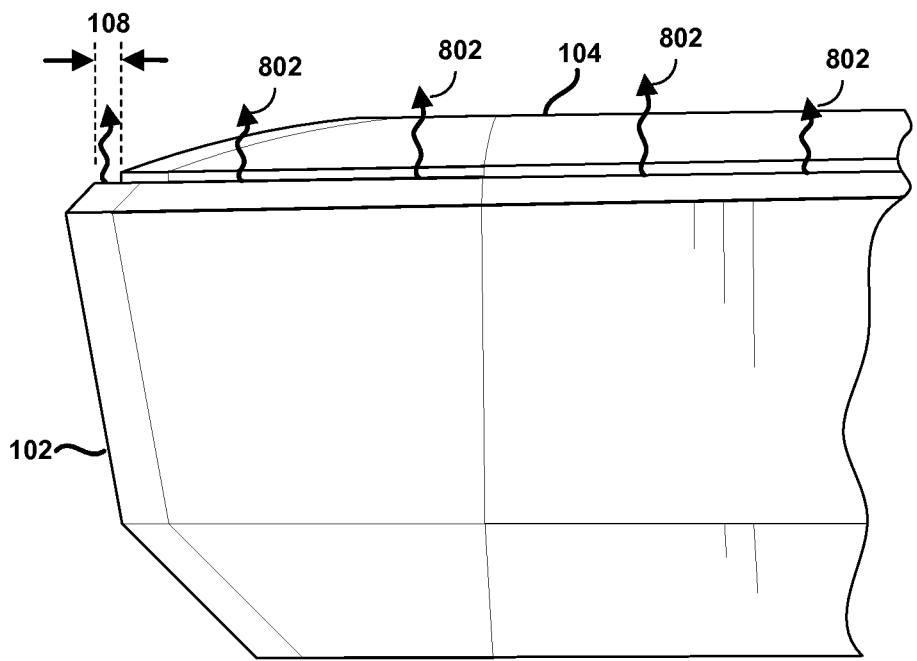
FIG. 8 is a side view of a portion of an enclosure, showing peripheral venting according to one embodiment.

FIG. 7 is a cross-sectional view of a portion of the bottom housing 102 mated to the top cover 104 of an enclosure, according to one embodiment. FIG. 8 is a side view of a portion of an enclosure, showing peripheral venting according to one embodiment. As suggested FIG. 7, air heated within the inner volume 702 of the enclosure may flow to the outside environment between the ventilation posts 304 and out through the peripheral air gap 108, thereby efficiently exchanging heat with the outside environment and cooling the inner volume 702 within the enclosure. Such heated air is suggested in FIGS. 7 and 8 at 802.

Advantageously, the mechanical interface between a first enclosure portion (e.g., bottom housing 102) and a second enclosure portion (e.g., top cover 104) may be configured to couple the first enclosure portion to the second enclosure portion. Such coupling may thereby define a housing interior volume and the mechanical interface may be configured to enable ventilation from the housing interior volume to the exterior of the device, as best shown in FIGS. 7 and 8. As shown and described herein, such mechanical interface may comprise ventilation posts 304 and corresponding tabs 404, although many other implementations are possible, as those of skill in this art may recognize. According to one embodiment, it is this mechanical interface that defines a gap, such as top-facing peripheral gap 108, between the first enclosure portion and the second enclosure portion. As shown in FIGS. 1-6, the mechanical interface may be further configured such that the gap comprises a plurality of individual adjacent gap sections, each separated by a feature of the mechanical interface, such as ventilation posts 304, for example. According to one embodiment, such a mechanical interface may be integral to the first enclosure portion and/or the second enclosure portion. For example, in the case wherein the housing 100 is formed of or comprises injection-molded plastic, the mechanical interface may be formed together with at least a portion of the first and/or second enclosure portions. That is, according to one embodiment, the same injection-molding process that creates the first and/or second enclosure portions may also form at least a portion of the mechanical interface there between.

One embodiment is a manufactured item comprising an electronic device at least partially enclosed within an enclosure as shown and described herein. For example, the electronic device may comprise a printed circuit board. According to one embodiment, the printed circuit board may be configured as a router or as a modem router.

Advantageously, one embodiment enables venting to occur within and/or around the mechanical interface between two enclosure parts, thereby obviating the need for additional structural features for venting in the middle of the enclosure part or relying on costly additional discrete parts to create such venting features. According to one embodiment, a two-part enclosure can effectively vent hot air by leveraging the same mechanical features used to couple the two parts. Moreover, designing the ventilation and internal structural supports (such as ventilation posts 304) together avoids the potential for unsightly visual molding marks that are common in plastic molding in which ventilation is disposed on the exterior surfaces.

While certain embodiments of the inventions have been described, these embodiments have been presented by way of example only, and are not intended to limit the scope of the inventions. Indeed, the novel methods, devices and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, those skilled in the art will appreciate that in various embodiments, the actual structures (such as, for example,) may differ from those shown in the figures. Depending on the embodiment, certain of the steps described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be is defined only by reference to the appended claims.

The invention claimed is:

1. An enclosure, comprising:
a bottom housing, the bottom housing defining a bottom and a plurality of sides rising from the bottom at an angle therewith to define an inner peripheral surface of the bottom housing;
a top cover configured to couple with the bottom housing to thereby define an inner housing volume, the top cover defining an outer periphery and configured to fit within the inner peripheral surface of the bottom housing to define a peripheral air gap between the outer periphery of the top cover and the inner peripheral surface of the bottom housing.

2. The enclosure of claim 1, wherein the bottom housing and the top cover are configured such that the peripheral air gap is co-extensive with the inner peripheral surface.

3. The enclosure of claim 1, wherein the bottom housing and the top cover are configured such that the peripheral air gap is defined adjacent a portion of the inner peripheral surface of the bottom housing.

4. The enclosure of claim 1, wherein the top cover comprises an overlap surface that extends beyond the inner peripheral surface of the bottom housing.

5. The enclosure of claim 4, wherein the overlap surface extends to form a side surface of the enclosure when the top cover is coupled to the bottom housing.

6. The enclosure of claim 1, wherein the peripheral air gap is configured to enable ventilation from the inner housing volume to outside of the enclosure.

7. The enclosure of claim 1, wherein the bottom housing and the top cover are configured such that the peripheral air gap comprises a plurality of individual air gap sections, each separated by a solid feature of at least one of the top cover and the bottom housing.

8. The enclosure of claim 1, wherein the bottom housing further comprises a plurality of ventilation posts and wherein the top cover further comprises a plurality of top cover features that are configured to align with and engage the plurality of ventilation posts.

9. The enclosure of claim 8, wherein the ventilation posts are further configured to support the top cover when the top cover is coupled to the bottom housing.

10. The enclosure of claim 8, wherein at least one of the ventilation posts is configured as a rib extending from at least one of the plurality of sides.

11. The enclosure of claim 8, wherein one of the ventilation posts and the top cover features comprises notches and the other one of the ventilation posts and the top cover features comprises tabs, wherein the tabs are configured to align and engage with the notches.

12. The enclosure of claim 11, wherein the tabs, when engaged with the notches, are configured to be retained within the notches through friction.

13. The enclosure of claim 1, wherein the bottom housing comprises a first snap-fit structure and wherein the top cover comprises a second snap-fit structure configured to engage and lock with the first snap-fit structure to secure the bottom housing and top cover together.

14. A device, comprising: a first enclosure portion;
a second enclosure portion; and a mechanical interface between the first enclosure portion and the second enclosure portion, the mechanical interface being configured to couple the first enclosure portion to the second enclosure portion to thereby define a housing interior volume, wherein the mechanical interface is further configured to define a gap between the first enclosure portion and the second enclosure portion to enable ventilation from the housing interior volume to an exterior of the device.

15. The device of claim 14, wherein the mechanical interface is configured to define a gap between the first enclosure portion and the second enclosure portion.

16. The device of claim 15, wherein the mechanical interface is further configured such that the gap extends at least partially around an outer periphery of the second enclosure portion.

17. The device of claim 16, wherein the mechanical interface is further configured such that the gap comprises a plurality of individual adjacent gap sections, each separated by a feature of the mechanical interface.

18. The device of claim 14, wherein the mechanical interface is integral to at least one of the first enclosure portion and the second enclosure portion.

19. The device of claim 14, wherein the mechanical interface comprises a first portion and a second portion and wherein the first portion of the mechanical interface is integral with the first enclosure portion and the second portion of the mechanical interface is integral with the second enclosure portion.

20. The device of claim 14, further comprising a printed circuit board disposed within the housing interior volume.

21. The device of claim 14, wherein the printed circuit board comprises a router.

\* \* \* \* \*